(12) United States Patent
Ratowsky et al.

(10) Patent No.: US 7,057,803 B2
(45) Date of Patent: Jun. 6, 2006

(54) LINEAR OPTICAL AMPLIFIER USING COUPLED WAVEGUIDE INDUCED FEEDBACK

(75) Inventors: Richard P. Ratowsky, Berkeley, CA (US); Ashish K. Verma, San Jose, CA (US); Daniel A. Francis, Oakland, CA (US)

(73) Assignee: Finisar Corporation, Sunnyvale, CA (US)

(*) Notice: Subject to any disclaimer, the term of this patent is extended or adjusted under 35 U.S.C. 154(b) by 140 days.

(21) Appl. No.: 10/882,444

(22) Filed: Jun. 30, 2004

(65) Prior Publication Data

US 2006/0001953 A1    Jan. 5, 2006

(51) Int. Cl.
*H01S 3/00* (2006.01)

(52) U.S. Cl. ...................................... 359/344
(58) Field of Classification Search ................ 359/334, 359/337; 372/50.1, 50.22
See application file for complete search history.

(56) References Cited

U.S. PATENT DOCUMENTS

| 4,990,989 A | 2/1991 | ElHamamsy et al. |
| 5,208,864 A | 5/1993 | Kaneda |
| 5,381,434 A | 1/1995 | Bhat et al. |
| 5,436,759 A | 7/1995 | Dijaili et al. |
| 5,541,949 A | 7/1996 | Bhat et al. |
| 5,737,474 A * | 4/1998 | Aoki et al. ................. 385/131 |

FOREIGN PATENT DOCUMENTS

JP    409307179 A    * 11/1997

OTHER PUBLICATIONS

Takemoto, A., et al., "*1.3-μm Distributed Feedback Laser Diode with a Grating Accurately Controlled by a New Fabrication Technique*," Journal of Lightwave Technology, vol. 7 No. 12, Dec., 1989.

* cited by examiner

*Primary Examiner*—Mark Hellner
(74) *Attorney, Agent, or Firm*—Workman Nydegger

(57) ABSTRACT

Systems and methods for extending a linear range of a semiconductor optical amplifier (SOA). A feedback layer is included in an SOA. The optical mode of the SOA is distributed between the feedback layer and the active region. As output optical power increases, the mode confinement of the active region increases and the mode is drawn from the feedback layer into the active region. The increase in the mode confinement offsets a loss of material gain such that the linear range of the SOA is extended. In one embodiment, the modal gain increases an higher output optical powers.

33 Claims, 4 Drawing Sheets

LINEAR OPTICAL AMPLIFIER USING COUPLED WAVEGUIDE INDUCED FEEDBACK

BACKGROUND OF THE INVENTION

1. The Field of the Invention

The present invention relates to the field of semiconductor optical amplifiers. More particularly, the present invention relates to semiconductor optical amplifiers with optical feedback.

2. The Relevant Technology

One of the ways that information or data is transferred from one location to another is through the use of optical fibers in an optical network. A basic optical fiber network includes a transmitter, an optical fiber and a receiver. The transmitter converts an electrical signal into an optical signal using a laser. The optical signal or light generated by the laser is launched into the optical fiber and transmitted through the optical network until it is received by the receiver. The receiver detects the optical signal generated by the laser and converts the detected optical signal into an electrical signal. The data are then extracted from the electrical signal.

As an optical signal travels in an optical fiber, it often attenuates for various reasons. In order to insure that the optical signal reaches its destination (the receiver, for example), it is often necessary to amplify the optical signal at some point during transmission. In fact, the optical signal may need to be amplified more than once. Traditionally, optical amplification is achieved by regenerating the optical signal at various places in the optical network. Regeneration involves converting the optical signal back to an electrical form, amplifying the electrical signal, and then converting the amplified electrical signal back into an optical signal with a laser.

In addition to being used in regeneration, optical amplifiers can also increase the power level of the optical signal generated by a transmitter laser before the optical signal is coupled to optical fiber. The optical amplifier in this context is often referred to as a "transmitter boost" amplifier.

More recently, optical amplifiers have been created that are able to amplify an optical signal without having to convert the optical signal into an electrical form, as required by conventional regeneration processes. One example of such an optical amplifier is a semiconductor optical amplifier (SOA). SOAs often have an active region that amplifies optical signals via stimulated emission as the optical signal propagates through the active region of the SOA.

One of the goals of optical amplifiers is to provide a linear gain for a range of input power. When an optical amplifier is used in a WDM (Wavelength Division Multiplexing) system, it is also useful to ensure that each channel or wavelength in the WDM signal experiences the same gain.

These goals have proved difficult to achieve. For example, SOAs exhibit a linear gain over a relatively small range of optical input power. As the input optical power begins to increase, the gain of the SOA loses its linearity because of a phenomenon referred to as gain compression or gain saturation. Generally stated, gain compression or saturation refers to the fact that the gain of an SOA drops as the optical power of the input optical signal increases. In other words, the optical gain of a saturated SOA is typically less than the optical gain of an unsaturated SOA. As a result, the linear range of an SOA is limited to a particular power range.

Many efforts have been made to reduce the gain saturation of an SOA and thereby extend the linear range of the SOA, but these attempts (increasing the size of the optical mode, inducing high carrier inversion, for example) are typically associated with practical or fundamental limits. High carrier inversion, for example, can be achieved at high operating current, but at the expense of power consumption and reliability risk. High saturation power can also be achieved by reducing the carrier lifetime, but also at the expense of higher operating current. Increasing the size of the optical mode similarly requires higher material gain to achieve the same amplifier gain, but higher operating current is required. A larger optical mode can also lead to higher loss because the optical field overlaps with more doped (and hence lossy) semiconductor.

In addition to limiting the linear range of an SOA, gain compression or saturation of an SOA can also compromise data transmission, for example, by causing intrachannel interference as well as crosstalk. In other words, at high optical output powers, the gain of an SOA ceases to be linear and the SOA is increasingly subject to crosstalk, intrachannel interference, and the like. What is needed are systems and methods for extending the linear range of the gain of an SOA.

BRIEF SUMMARY OF THE INVENTION

These and other limitations are overcome by the present invention, which relates to semiconductor optical amplifiers that have an extended linear range for optical output power. In one embodiment of the invention, a semiconductor optical amplifier includes an active region or layer formed between an n-type semiconductor layer and a p-type semiconductor layer. These layers are formed on a feedback layer which in turn is formed or grown on a substrate.

Each layer in the semiconductor optical amplifier has a refractive index. The refractive index of the active region is typically the largest and the refractive index of the feedback layer is typically the next largest. When an optical signal is incident into the semiconductor optical amplifier at low optical power, the optical mode is distributed between the active region and the feedback layer. As the optical output power increases, the refractive index of the active region also increases. The mode confinement of the active region therefore also increases with increasing optical power. As a result, the optical mode is drawn back into the active region from the feedback layer. In this manner, the feedback layer provides optical feedback to the active region. In other words, the ability to increase the mode confinement as the material gain decreases extends the range over which an semiconductor optical amplifier can provide linear optical amplification.

The modal gain of the semiconductor optical amplifier can be expressed as a product of the material gain and the mode confinement. The material gain is typically fixed (for fixed operating current) and decreases with increased optical output power. This corresponds to the gain compression at increased optical output power. The mode confinement, however, can be varied via the feedback layer and can be changed with increased optical output power. In other words, the feedback layer can be configured to increase the mode confinement to offset the decreasing material gain at higher optical output powers. This extends the linear range in some embodiments as the increasing mode confinement offsets the decreasing material gain.

In some embodiments, however, the gain of the semiconductor optical amplifier can be increased at relatively higher optical powers. More specifically, the modal gain of the semiconductor optical amplifier can increase at higher optical output power. In other words, the feedback layer can be configured to increase the gain of the semiconductor optical amplifier at higher optical powers, in contrast to conventional semiconductor amplifiers where the gain decreases at higher optical powers. This gain expansion typically occurs near the end of the linear range.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 2A illustrates an embodiment of a semiconductor optical amplifier where a feedback layer is etched through;

DETAILED DESCRIPTION OF THE PREFERRED EMBODIMENTS

Semiconductor Optical Amplifiers (SOAs) amplify optical signals without converting the incident optical signals to electrical signals. SOAs use stimulated emission to amplify incident optical signals. As previously described, however, SOAs often experience gain compression as the output optical power increases. Gain compression is often associated with the undesirable effects of both intersymbol interference and crosstalk.

Embodiments of the present invention relate to extending the linear range of operation of an SOA. Extending the linear range enables the SOA to linearly amplify an optical signal over a wider range of optical power. The linear range of operation of an SOA is extended by providing optical feedback that linearizes the gain of the SOA as the optical output power increases. Another advantage of some embodiments of the invention is the ability to increase the gain as output power increases (gain expansion) in contrast to gain compression or saturation where the gain decreases as the optical output power increases. The range over which an SOA can linear amplify an optical signal is expanded, but the SOA eventually experiences gain compression as when the mode confinement can non longer be increased.

Figure 1B:
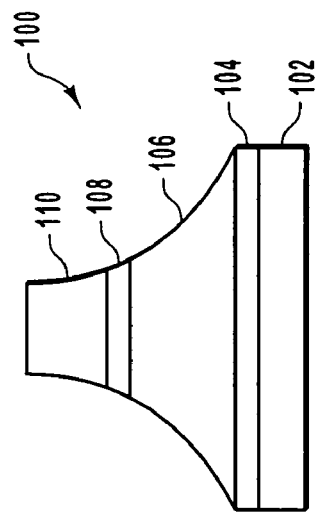
FIG. 1B illustrates a front view of the semiconductor optical amplifier of FIG. 1A.
Figure 1A:
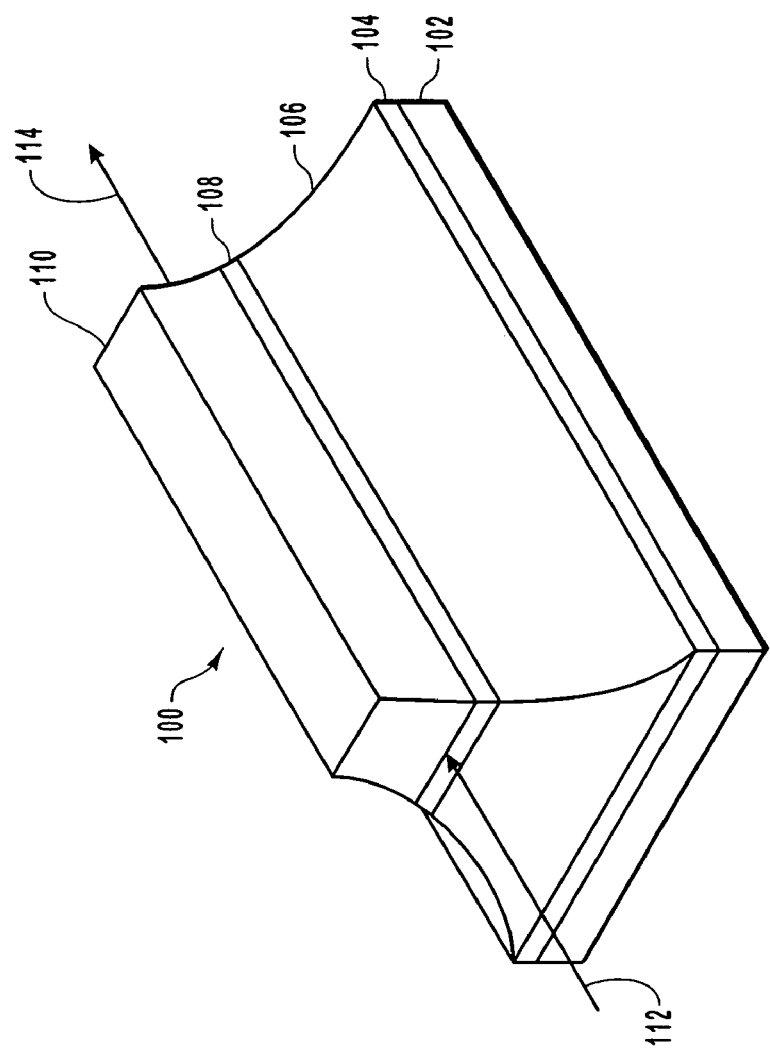
FIG. 1A illustrates a perspective view of one embodiment of a semiconductor optical amplifier with optical feedback.

FIG. 1A illustrates a perspective view of one embodiment of a semiconductor optical amplifier with optical feedback. FIG. 1B illustrates side front view of the SOA illustrated in FIG. 1A. SOAs often include a pn-junction which is represented by the layer 110 and the layer 106. In this example, the layer 110 is a p-type semiconductor material layer and the layer 106 is an n-type semiconductor material layer. The layers 106 and 110 are also examples of confinement layers.

Although an SOA can be formed using a simple pn-junction, FIGS. 1A and 1B illustrate another semiconductor layer 108 (also referred to herein as an "active region") that is sandwiched between the layer 110 and the layer 106. The layer 108 is typically a semiconductor material and the layer 108 forms an active region of the SOA 100. Typically, the active region or layer 108 has a higher refractive index than the surrounding layers 110 and 106 and forms, in effect, a waveguide layer. The refractive index of the layer 108 helps confine the optical mode during optical amplification of an optical signal.

The layer 108 or the active region can have various formulations. In one embodiment, the active region is a multi-quantum well structure. For example, the active region may include 5 quantum wells interleaved with 6 barrier layers. The material system of the active region is InGaAlAs (Indium Gallium Aluminum Arsenide). Each quantum well has a thickness of 6 nanometers with 1.78% compressive strain. The barrier layers are 5 nanometers thick and unstrained with a 75% Aluminum content $((In_{0.52}Al_{0.48})_{0.75}(In_{0.53}Ga_{0.47})_{0.25})$. The refractive index of the active region as a whole, as previously stated is usually higher than the surrounding layers. In another embodiment, the active region may be a uniform semiconductor material whose refractive index is higher than the surrounding layers 110 and 106. One of skill in the art can appreciate that other formulations of the active region or layer 108 are contemplated by embodiments of the invention.

FIGS. 1A and 1B further illustrate a feedback layer 104 that is formed on a substrate 102. The feedback layer is also a semiconductor material and has a refractive index that is higher than the surrounding layer 106 and the substrate 102. In effect, the feedback layer 104 is a second waveguide.

FIGS. 1A and 1B also serve to describe how a SOA is formed. In this example, the various layers are formed epitaxially one after the other. Thus, the feedback layer 104 may be formed epitaxially on the substrate 102. The layer 106 is then similarly formed epitaxially on the feedback layer 104. The layers 108 and 110 are also formed epitaxially. One of skill in the art can appreciate other methods for forming the structure illustrated in FIG. 1A, including Metallo-Organic Chemical Vapor Deposition, Molecular Beam Epitaxy, and the like.

More specifically in one embodiment, the growth of the SOA begins with an InP substrate or by forming an InP buffer layer on an InP substrate. Next, a layer of InGaAsP (the feedback layer) is grown. The feedback layer may have a thickness on the order, for example, of 75 nanometers. Next, another layer of InP is grown. This layer is usually an n-type layer and has a thickness on the order of 2 micrometers. The active region is formed next as previously described. Finally, another layer of p-type InP is formed on the active region. This layer has a thickness, for example, of 0.5 micrometers.

As illustrated in FIGS. 1A and 1B, the SOA 100 is then etched such that the active region or layer 108 is bounded laterally by the etch. In other words, a ridge is formed. In this embodiment, the feedback layer 104 is not etched through, but remains a planar slab waveguide. In another embodiment, the feedback layer 104 may also be etched through. When the feedback layer 104 is etched through, the feedback layer 104 typically has a width that is greater than the width of the active region 108. The SOA 100 can become a buried heterostructure by forming or growing a blocking layer adjacent the ridge formed by the etching process. A metal contact is then deposited on top of the SOA 100.

Once formed, the SOA 100 is able to amplify optical signals. As illustrated in FIG. 1A, an optical signal 112 is incident into one facet of the SOA 100. The optical signal is amplified and exits another facet of the SOA 100 as the amplified optical signal 114. In this example, the confinement of the optical mode is related to both the active region 108 and the feedback layer 104. The strongest coupling between the active region 108 and the feedback layer 104 usually occurs at lower optical powers. At higher optical powers, the active region 108 becomes detuned from the feedback layer and the optical mode is drawn back into the active region. In other words, the mode confinement of the active region increases.

The feedback layer 104 is also a waveguide as previously stated and provides feedback that linearizes the gain of the SOA 100 as the optical output power increases. In other words, the linear range of the SOA 100 is extended. Although the SOA 100 may still experience gain compression, the gain compression occurs at higher levels of output power compared to when gain compression occurs in the absence of the feedback layer.

Figure 2A:
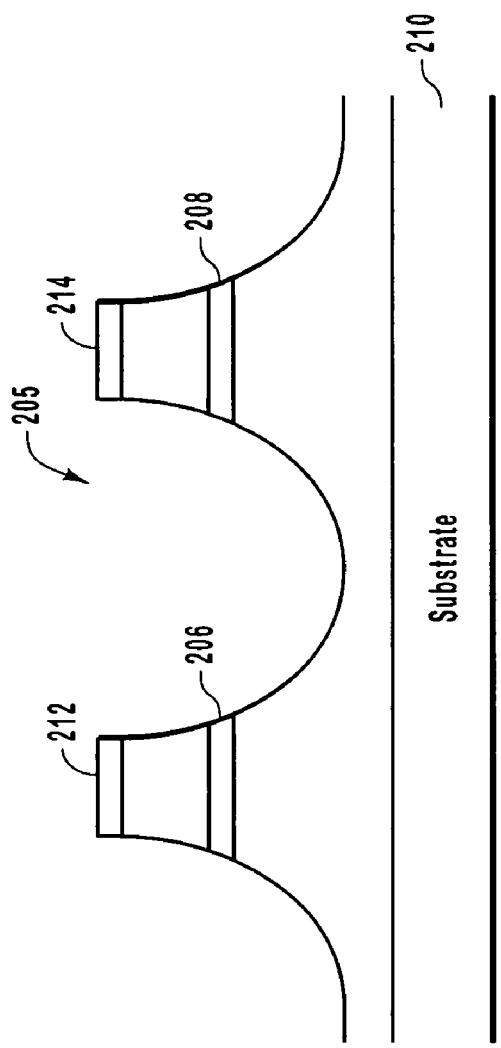

FIGS. 1A and 1B illustrate one example of a structure for extending the linear gain of an SOA. The ridge can be etched and then buried to form a buried heterostructure. FIG. 2A illustrates another structure of an SOA for extending the linear range of the SOA. In FIG. 2A, the feedback layer 202 has been etched through. The feedback layer 202 is then buried with a bounding material 207 as previously described. Because the feedback layer 202 is laterally bounded by the material 207, in contrast to the relatively unbounded feedback layer in FIG. 1B, the coupling of the feedback layer 202 with the active region 204 is changed.

Figure 2B:
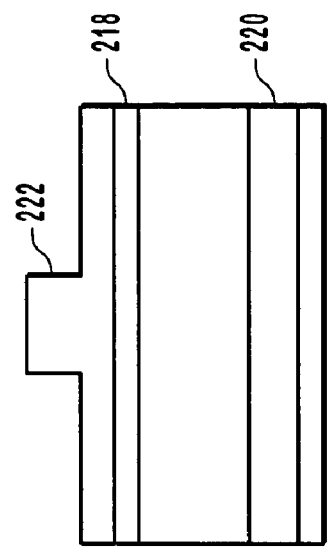
FIG. 2B illustrates an embodiment of a semiconductor optical amplifier where the feedback layer is adjacent the active region.

FIG. 2B illustrates coupled waveguides 205 formed on a substrate 210. In this example, the feedback layer 206 (also referred to as a coupling waveguide) is laterally adjacent to the active region 208. The feedback layer 206 and the active region 208 are bounded laterally by an etch. As previously stated, the array 205 can be a buried heterostructure. The feedback layer 206 and the active region 208 are usually close enough to permit an optical signal to couple as described herein. In addition to other parameters discussed below, a separate contact 212 can be used to tune the refractive index of the feedback layer 206. Changing the refractive index can affect how strongly the optical mode couples between the feedback layer 206 and the active region 208.

Figure 2C:
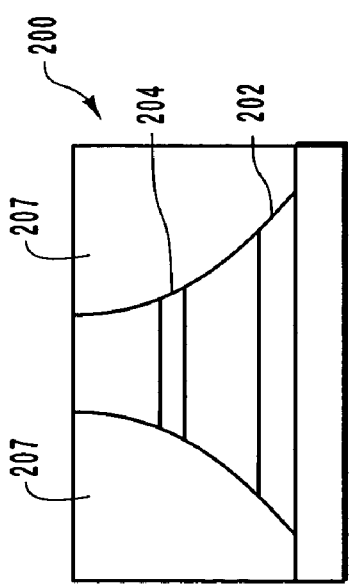
FIG. 2C illustrates an embodiment of a semiconductor optical amplifier where the feedback layer includes distributed Bragg layers.

FIG. 2C illustrates another embodiment of a feedback layer 214 that provides optical feedback for the active region 216. In this embodiment, the feedback layer 214 includes distributed Bragg reflector layers. Alternatively, the feedback layer 214 may include multiple layers of quaternary semiconductor (InGaAsP, for example) and InP that are not necessarily formed as distributed Bragg reflector layers, although they may be formed as distributed Bragg reflector layers. Alternatively, the feedback layer may be an Anti-Resonant Reflecting Optical Waveguide (ARROW) structure, which includes low index material surrounded by thin layers of higher index materials. In another embodiment, the feedback layer 206 in FIG. 2B may also include distributed Bragg Reflector layers. In addition, the feedback layer 214 may also be etched through.

Figure 2D:
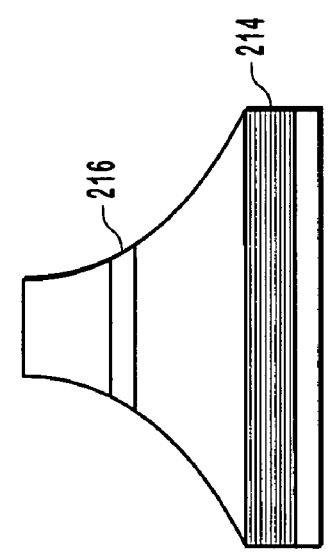
FIG. 2D illustrates another embodiment of a semiconductor optical amplifier where a ridge is formed in a confinement layer without etching through the active region or the feedback layer.

FIG. 2D illustrates another embodiment of a semiconductor optical amplifier. In FIG. 2D, neither the active region 218 or the feedback layer 220 is etched through. In this example, a ridge 222 is formed in the structure. In some of the embodiments, the location of the feedback layer can change relative to the active region. For example, the feedback layer may be formed above the active region rather than below the active region.

Figure 3:
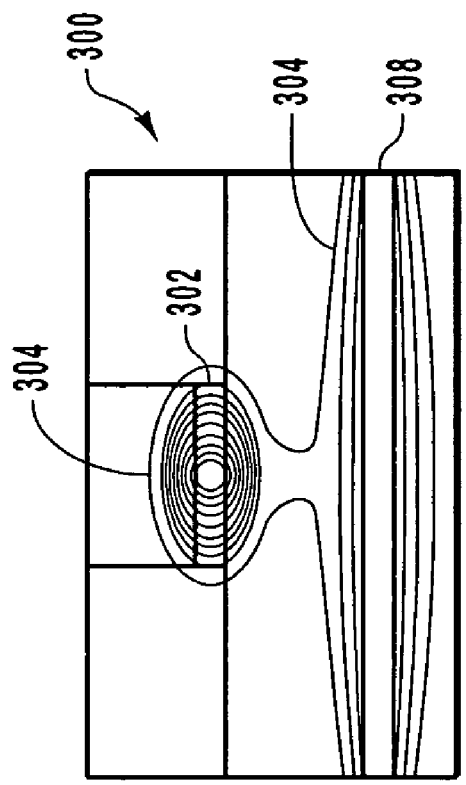
FIG. 3 illustrates an example of the optical mode in a semiconductor optical amplifier with optical feedback at low optical output power.

FIG. 3 illustrates the optical mode of the SOA 100 at relatively low optical output power. In FIG. 3, the optical mode 304 is not strictly confined to the active region 302, but is also present in the feedback layer 308. At low optical powers, the active mode may couple strongly with the feedback layer 308. The active optical mode is well phase matched between the active region 302 and the feedback layer 308 at low optical powers.

Figure 4:
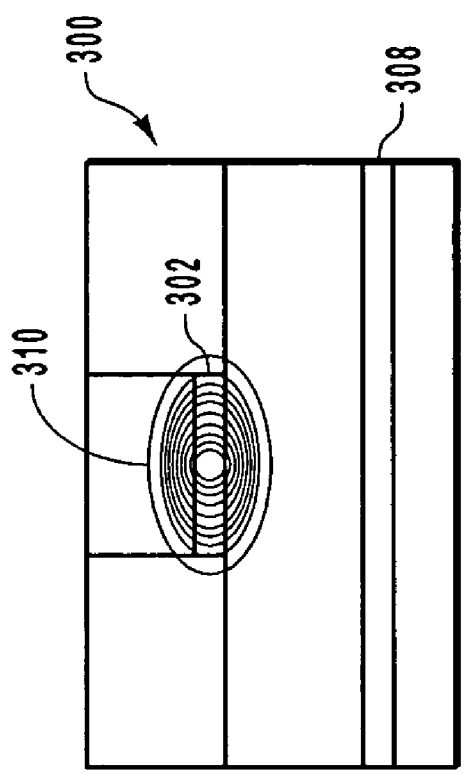
FIG. 4 illustrates an example of the optical mode in a semiconductor optical amplifier with optical feedback at high optical output power.

FIG. 4 illustrates the optical mode 310 after the SOA 300 has increased optical output power. In FIG. 4, the confinement of the optical mode 310 in the active region 302 is increased from the situation of FIG. 3, which illustrates the optical mode at relatively lower optical output power. FIG. 4 illustrates that at higher optical powers and as a result of the changed refractive index of the active region 302, the mode is drawn back into the active region 302. In other words, the mode confinement of the active region 302 increases.

The feedback layer provides optical feedback to extend the linear range of operation, in one embodiment, in the following manner. As the optical output power of the SOA 300 increases, stimulated emission removes carriers from the active region and the material gain decreases. Thus, the removal of the carriers by stimulated emission at increasing output power results in gain compression or gain saturation. The reduction of the carrier density, however, also increases the refractive index of the active region 302. The increase in the refractive index of the active region 302 tends to pull the optical mode into the active region 302. In other words, the increase in the refractive index increases the optical confinement of the optical mode in the active region 302.

The modal gain of an SOA can be defined as the product of the material gain and the mode confinement. The feedback layer 308 does not have an impact on the material gain. Thus, the material gain decreases as output power increases as stated previously. The feedback layer 308, however, does have an impact on the mode confinement. The mode confinement of the active region increases as optical power increases because the optical mode is drawn back into the active region 302 from the feedback layer 308 as the optical power increases. The increase of the mode confinement in the active region 302 offsets the decrease in the material gain and extends the linear range of the SOA 300. In conventional SOAs, the change in mode confinement is negligibly small and has little impact on the saturation power or gain compression of the SOA.

Figure 5:
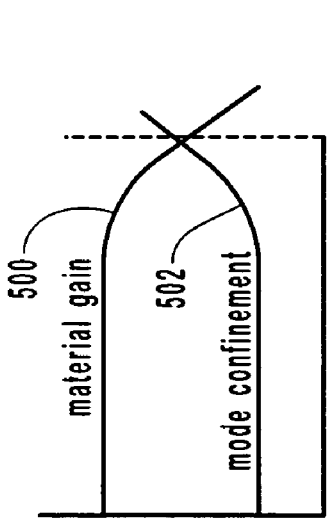
FIG. 5 illustrates the relationship between material gain and mode confinement in a semiconductor optical amplifier with optical feedback.

The impact of the feedback layer (such as the feedback layers 104, and 308) is illustrated in FIG. 5, which depicts the material gain and the mode confinement as a function of output optical power. As shown in FIG. 5, the material gain 500 begins to decrease as the output optical power increases. At the same time, the mode confinement 502 increases. As previously stated, the modal gain is the product of the material gain 500 and the mode confinement 502. The mode confinement 502 thus compensates for the decreasing material gain at higher optical output power. The linear range of the SOA is extended using the feedback layer. However, as the output optical power continues to increase, the increased mode confinement eventually saturates and the modal gain decreases.

The design of the feedback layer has an impact on the mode confinement. In other words, the design or formulation of the feedback layer can impact the shape of the mode confinement 502 curve in FIG. 5. The feedback layer can be designed such that the decrease in material gain is substantially compensated by the increase in mode confinement thereby extending the linear range of the SOA.

Various parameters of the feedback layer can be adjusted to impact the mode confinement. Examples of parameters include, but are not limited to, thickness of the feedback layer, location of the feedback layer with respect to the active region (thickness of the layer 106, for example), material composition or formulation of the feedback layer CAN refractive index of the feedback layer, modal index of the feedback layer, and any combination thereof. The feedback layer may have a thickness, by way of example and not limitation of 50–200 nanometers. The thickness of the layer 106 may be in a range from 0.5–3.0 micrometers. The material composition may be described in terms of the bandgap range, which relates to the emitted wavelengths. A bandgap range of about 1100–1400 nm in InGaAsP, for example, may correspond to wavelengths that include 1310 nm and 1550 nm. Another parameter may be the number and type of layers in the feedback layer. One of skill in the art can also appreciate that the formulation of the active region can also be adjusted to impact the mode confinement and/or the material gain of the active region.

Figure 6:
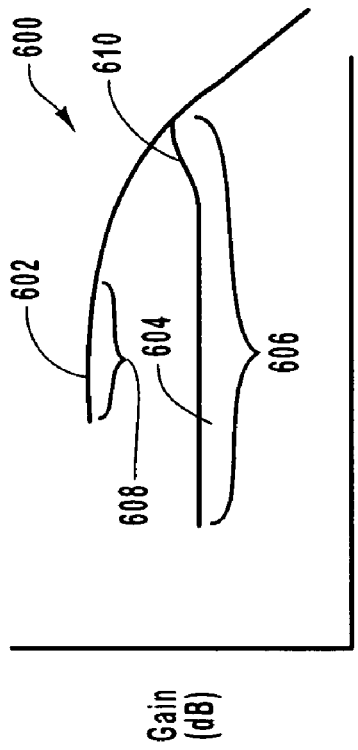
FIG. 6 illustrates an example the extended linear range of a semiconductor optical amplifier with optical feedback and also illustrates an increase in gain at high optical output power.

FIG. 6 illustrates the extended linear range of an SOA. FIG. 6 illustrates that waveguide coupling (both the feedback layer and,the active region can be referred to as waveguides) linearizes the gain of the SOA. The curves 602 and 604 in FIG. 6 represent plots of the gain versus the output power in an SOA. The curve 602 is for an SOA that does not include a feedback layer and has a relatively narrow range 608 over which optical amplification occurs linearly. In contrast, the curve 604 is for an SOA that includes a feedback layer and has an extended linear range 606. The curve 604 further illustrates, for some embodiments of the invention, that the gain 610 actually increases as output power increases in some embodiments before gain compression occurs.

Embodiments of the SOA described herein can also be used to improve the flatness of the gain curve. The flatness refers to the variation of the gain over the wavelength band of interest. For a conventional SOA, the gain flatness is usually best near the peak of the gain. However, the saturation power may improve if the signal is offset to the long wavelength side of the peak of the gain in conventional SOAs.

Figure 7:
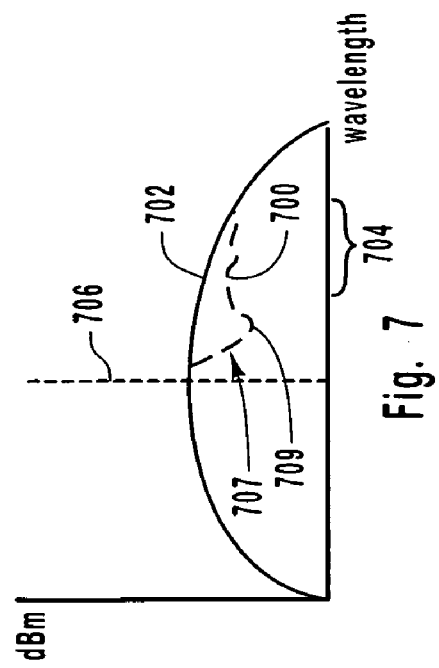
FIG. 7 illustrates the improved gain flatness for a wavelength band of interest in accordance with one embodiment of a semiconductor optical amplifier with optical feedback.

FIG. 7 illustrates advantages of the present invention where the gain 702 of a conventional SOA has a gain peak 706. The dashed line 707 represents an example of how the gain flatness is improved by the feedback layer. In this example, the feedback provided by the feedback layer is wavelength dependent and the gain reduction is maximized (point 709) where the active region and the feedback layer are phase matched. This point can be selected such that the flatness 700 of the gain is improved for the wavelength band 704 of interest.

Figure 8:
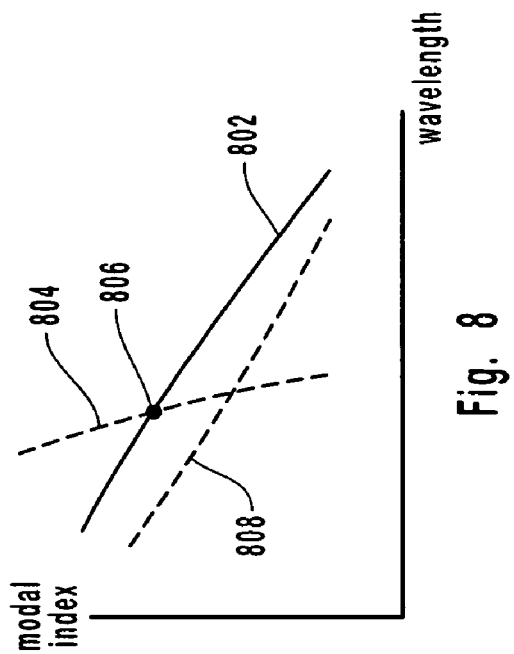
FIG. 8 illustrates an example where the optical feedback is independent of the optical wavelength.

In another embodiment, the coupling of the feedback layer to the active region can be made independent of the wavelength such that dips in the gain spectrum do not occur. This is useful, for example, in applications requiring broad band performance. FIG. 8 illustrates plots of the modal index as a function of the wavelength. The curve 802 represents the modal index of the active region. The curve 804 represents an example where the coupling of the feedback layer to the active region is wavelength dependent. At the point 806, the feedback layer strongly couples with the active region and corresponds to a dip in the gain curve.

In contrast, the curve 808 corresponds to an example of a feedback layer where the coupling of the feedback layer to the active region is independent of the wavelength. In other words, the change in the modal index for both the active region and the feedback layer is substantially the same as a function of the wavelength. The strength of the confinement of the optical mode to the active region decreases as the curve 808 moves closer to the curve 802. Thus, the strength of the coupling of the feedback layer with the active region can be configured to be wavelength dependent or wavelength independent. Examples of parameters that can move the curve 808 or 804 with respect to the curve 802 include the thickness of the feedback layer, and the composition of the feedback layer. The strength of the coupling can also be controlled by formulating the feedback layer and/or the active region based on the other parameters previously discussed.

Another advantage of embodiments of the present invention is to improve the far field of an SOA. A symmetric (round, for example) far field helps to efficiently couple an optical signal with an optical fiber. However, the far field of a conventional SOA is not usually round. The divergence angles of a conventional SOA are about 22 degrees by 27 degrees. With a feedback layer, the far field of the SOA is substantially round. In one embodiment, the divergence angles are approximately 17 degrees by 17 degrees. One of skill in the art can appreciate that the identified divergence angles are exemplary in nature and that the present invention is not limited to these divergence angles.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A semiconductor optical amplifier with extended linear range, the semiconductor optical amplifier comprising:
    a feedback layer formed on a substrate;
    a pn junction formed on the feedback layer, the pn junction including an n type semiconductor layer and a p type semiconductor layer;
    an active region formed at the pn junction such that the active region is between the n type semiconductor layer and the p type semiconductor layer; and
    wherein a coupling of an optical mode between the feedback layer and the active region decreases with increasing optical output power to extend a linear range of the semiconductor optical amplifier.

2. A semiconductor optical amplifier as defined in claim 1, wherein the active region is etched through and the feedback layer is not etched through.

3. A semiconductor optical amplifier as defined in claim 1, wherein the active region and the feedback layer are both etched through.

4. A semiconductor optical amplifier as defined in claim 1, wherein the feedback layer comprises one of:
    distributed Bragg layers;
    an ARROW structure; and
    at least two semiconductor layers.

5. A semiconductor optical amplifier as defined in claim 1, wherein a modal index of the feedback layer with respect to a modal index of the active region is independent of a wavelength of an incident optical signal.

6. A semiconductor optical amplifier as defined in claim 1, wherein a modal index of the feedback layer with respect to a modal index of a modal index of the active region is dependent on a wavelength of an optical signal.

7. A semiconductor optical amplifier as defined in claim 1, wherein the feedback layer provides optical feedback such that a mode confinement of the active region for an optical mode increases at increased optical power.

8. A semiconductor optical amplifier as defined in claim 1, wherein the feedback layer is configured to increase a mode confinement of the active region as a material gain of the active region decreases to extend the linear range.

9. A semiconductor optical amplifier as defined in claim 1, wherein the feedback layer is configured to increase a mode confinement of the active region such that at a particular range of output optical power, a gain of the semiconductor optical amplifier increases.

10. A semiconductor optical amplifier as defined in claim 1, wherein the active region is etched through and a blocking layer is grown to laterally bound the active region and form a buried heterostructure.

11. A semiconductor optical amplifier as defined in claim 1, wherein a material composition of the feedback layer is Indium Gallium Arsenide Phosphide.

12. A semiconductor optical amplifier as defined in claim 1, wherein the feedback layer causes a far field of the semiconductor optical amplifier to be substantially symmetrical.

13. A semiconductor optical amplifier as defined in claim 1, wherein a strength of coupling of an optical mode between the feedback layer and the active region is related to at least one of:
    a thickness of the feedback layer;
    a thickness of the n type semiconductor layer;
    a material composition of the feedback layer;
    a refractive index of the feedback layer;
    a modal index of the feedback layer;
    number of layers in the feedback layer;
    a thickness of the active region;
    a width of the active region in a buried heterostructure;
    a width of a ridge;
    a thickness of a confinement layer; and
    a composition of a confinement layer.

14. A semiconductor optical amplifier with an extended linear range for optical output power, the semiconductor optical amplifier comprising:
    a feedback layer formed on a substrate;
    an n-type semiconductor layer formed on the feedback layer, wherein the feedback layer has a refractive index higher than a refractive index of the substrate and a refractive index of the n-type feedback layer;
    an active region formed on the n-type semiconductor layer having a refractive index higher than the refractive index of the feedback layer, wherein the feedback layer provides optical feedback to the active region to increase a mode confinement of the active region to offset a decrease in material gain of the active region such that a linear range of the semiconductor optical amplifier is at least extended by the optical feedback; and
    a p-type semiconductor layer formed on the active region.

15. A semiconductor optical amplifier as defined in claim 14, wherein the optical feedback of the feedback layer is dependent on a wavelength of an incident optical signal.

16. A semiconductor optical amplifier as defined in claim 14, wherein the optical feedback of the feedback layer is independent of a wavelength of an incident optical signal.

17. A semiconductor optical amplifier as defined in claim 14, wherein the feedback layer is a uniform semiconductor layer.

18. A semiconductor optical amplifier as defined in claim 14, wherein the feedback layer includes one or more distributed Bragg layers.

19. A semiconductor optical amplifier as defined in claim 14, wherein a ridge is etched in the p-type layer without etching through either the active region or the feedback layer.

20. A semiconductor optical amplifier as defined in claim 19, wherein the active region is bounded laterally by a blocking layer to form a buried heterostructure.

21. A semiconductor optical amplifier as defined in claim 14, wherein the active region and the feedback layer are etched through.

22. A semiconductor optical amplifier as defined in claim 21, wherein the active region and the feedback layer are laterally bounded by a blocking layer to form a buried heterostructure.

23. A semiconductor optical amplifier as defined in claim 14, wherein a strength of coupling of an optical mode between the feedback layer and the active region is related to at least one of:
    a thickness of the feedback layer;
    a thickness of the p-type semiconductor layer;
    a material composition of the feedback layer;
    a refractive index of the feedback layer;
    a modal index of the feedback layer; and
    number of layers in the feedback layer.

24. A semiconductor optical amplifier as defined in claim 14, wherein a strength of coupling between the feedback layer and the active region decreases as output optical power increases such that an increasing mode confinement of the active region offsets a decreasing material gain to extend the linear range of the semiconductor optical amplifier.

25. A semiconductor optical amplifier as defined in claim 14, wherein the optical feedback changes a mode confinement such that a modal gain of the semiconductor optical amplifier increases as output optical power increases.

26. A semiconductor optical amplifier that extends a linear range of optical output power, the semiconductor optical amplifier comprising:
   a first ridge structure formed on a substrate, the first ridge structure comprising:
      an n-type semiconductor layer;
      an active region formed on the n-type semiconductor layer; and
      a p-type semiconductor layer; and
   a second ridge structure formed on the substrate laterally adjacent to the first ridge structure, the second ridge structure comprising:
      an n-type semiconductor layer;
      a feedback layer formed on the n-type semiconductor layer,
      wherein the feedback layer is optically coupled with the active region such that a strength of coupling between the feedback layer and the active region decreases as output optical power of the semiconductor optical amplifier increases; and
      a p-type semiconductor layer.

27. A semiconductor optical amplifier as defined in claim 26, wherein the strength of coupling between the feedback layer and the active region is dependent on a wavelength of an optical signal being amplified.

28. A semiconductor optical amplifier as defined in claim 26, wherein the strength of coupling between the feedback layer and the active region is independent of a wavelength of an optical signal being amplified.

29. A semiconductor optical amplifier as defined in claim 26, wherein a strength of coupling of an optical mode between the feedback layer and the active region is related to at least one of:
   a thickness of the feedback layer;
   a thickness of the p-type semiconductor layer;
   a material composition of the feedback layer;
   a refractive index of the feedback layer;
   a modal index of the feedback layer;
   number of layers in the feedback layer; and
   a voltage applied to a contact of the second ridge structure.

30. A semiconductor optical amplifier as defined in claim 26, wherein the feedback layer comprises one or more distributed Bragg layers.

31. A semiconductor optical amplifier as defined in claim 26, wherein a ridge is etched in the p-type layer without etching through the active region or the feedback layer.

32. A semiconductor optical amplifier as defined in claim 26, wherein the feedback layer and the active region are buried in a blocking layer.

33. A semiconductor optical amplifier as defined in claim 26, wherein the feedback layer couples with the active region to increase a modal gain of the semiconductor optical amplifier at a particular range of optical output power.

* * * * *